US012463667B2

(12) United States Patent
Nakahashi

(10) Patent No.: US 12,463,667 B2
(45) Date of Patent: Nov. 4, 2025

(54) MULTIPLEXER

(71) Applicant: Murata Manufacturing Co., Ltd., Nagaokakyo (JP)

(72) Inventor: Norihiko Nakahashi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 315 days.

(21) Appl. No.: 18/243,203

(22) Filed: Sep. 7, 2023

(65) Prior Publication Data

US 2024/0097714 A1   Mar. 21, 2024

(30) Foreign Application Priority Data

Sep. 15, 2022   (JP) ................. 2022-146741

(51) Int. Cl.
    *H04W 48/18* (2009.01)
    *H03H 7/46* (2006.01)
    *H04B 1/00* (2006.01)

(52) U.S. Cl.
    CPC .......... *H04B 1/0057* (2013.01); *H03H 7/463* (2013.01)

(58) Field of Classification Search
    CPC .... H04B 1/0057; H03H 7/463; H03H 9/6483; H03H 9/72; H03H 9/725; H03H 9/706
    USPC .................................... 455/552.1
    See application file for complete search history.

(56) References Cited

U.S. PATENT DOCUMENTS

| 2018/0069529 A1* | 3/2018 | Bi ............................ H03H 9/54 |
| 2018/0131349 A1 | 5/2018 | Takata |
| 2020/0228099 A1* | 7/2020 | Daimon ............... H04B 1/0458 |

FOREIGN PATENT DOCUMENTS

| CN | 111448758 A | * | 7/2020 | .......... H03H 9/6496 |
| JP | 2018-074539 A | | 5/2018 | |

* cited by examiner

Primary Examiner — Tanmay K Shah
(74) Attorney, Agent, or Firm — Keating & Bennett, LLP

(57) ABSTRACT

A multiplexer includes a first filter connected between a common terminal and an input/output terminal and having a pass band including a first frequency band, a second filter connected between the common terminal and an input/output terminal and having a pass band including a second frequency band higher than the first frequency band, and an additional circuit connected in parallel to a path connecting the common terminal and the input/output terminal. The additional circuit includes a longitudinally coupled resonator including IDT electrodes. If a peak frequency in an IDT response occurring in a bandpass characteristic of the additional circuit is f1, and if a frequency corresponding to a lowest impedance among frequencies higher than the second frequency band in an impedance characteristic viewing the multiplexer from the common terminal is f2, $f2\times(1-0.0012) \leq f1 \leq f2\times(1+0.0012)$ is satisfied.

20 Claims, 12 Drawing Sheets

MULTIPLEXER

CROSS REFERENCE TO RELATED APPLICATIONS

This application claims the benefit of priority to Japanese Patent Application No. 2022-146741 filed on Sep. 15, 2022. The entire contents of this application are hereby incorporated herein by reference.

BACKGROUND OF THE INVENTION

1. Field of the Invention

The present invention relates to a multiplexer.

2. Description of the Related Art

Japanese Unexamined Patent Application Publication No. 2018-74539 discloses the circuit configuration of a multiplexer including a transmission-side filter (a first filter) using a first frequency band as a pass band and a reception-side filter (a second filter) using a second frequency band as a pass band. An additional circuit having a longitudinally coupled resonator is connected to an input/output terminal of the first filter. This enables an attenuation characteristic in a predetermined frequency band for the first filter to be improved.

SUMMARY OF THE INVENTION

However, in the multiplexer described in Japanese Unexamined Patent Application Publication No. 2018-74539, the attenuation characteristic in the second frequency band for the first filter is improved due to the additional circuit. However, there is an issue of attenuation characteristic deterioration outside the second frequency band for the first filter because of the occurrence of a response (a spurious emission) attributed to the interdigital (IDT) electrode structure of the longitudinally coupled resonator.

Hence, preferred embodiments of the present invention provide multiplexers each achieving an improved attenuation characteristic.

A multiplexer according to an aspect of a preferred embodiment of the present invention includes a common terminal, a first input/output terminal, a second input/output terminal, a first filter circuit that is connected between the common terminal and the first input/output terminal and that has a pass band including a first frequency band, a second filter circuit that is connected between the common terminal and the second input/output terminal and that has a pass band including a second frequency band higher than the first frequency band, and an additional circuit connected in parallel to at least a portion of a path connecting the common terminal and the first input/output terminal. The additional circuit includes a resonator including a plurality of interdigital transducer electrodes on a piezoelectric substrate. In a case where a peak frequency for a response that occurs in a bandpass characteristic of the additional circuit and that is attributed to the interdigital transducer electrodes is f1, and a frequency included in a frequency higher than the second frequency band and that corresponds to a lowest impedance in an impedance characteristic at a time of viewing the first filter circuit, the second filter circuit, and the additional circuit from the common terminal is f2, $f2\times(1-0.0012) \leq f1 \leq f2\times(1+0.0012)$ is satisfied.

A multiplexer according to an aspect of the present invention includes a common terminal, a first input/output terminal, a second input/output terminal, a first filter circuit that is connected between the common terminal and the first input/output terminal and that has a pass band including a first frequency band, a second filter circuit that is connected between the common terminal and the second input/output terminal and that has a pass band including a second frequency band higher than the first frequency band, and an additional circuit connected in parallel to at least a portion of a path connecting the common terminal and the first input/output terminal. The additional circuit includes a resonator including a plurality of interdigital transducer electrodes on a piezoelectric substrate. In a case where a peak frequency for a response that occurs in a bandpass characteristic of the additional circuit and that is attributed to the interdigital transducer electrodes is f1, and a frequency included in a frequency lower than the second frequency band and that corresponds to a lowest impedance in an impedance characteristic at a time of viewing the first filter circuit, the second filter circuit, and the additional circuit from the common terminal is f2, $f2\times(1-0.0012) \leq f1 \leq f2\times(1+0.0012)$ is satisfied.

According to preferred embodiments of the present invention, multiplexers each achieving an improved attenuation characteristic are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
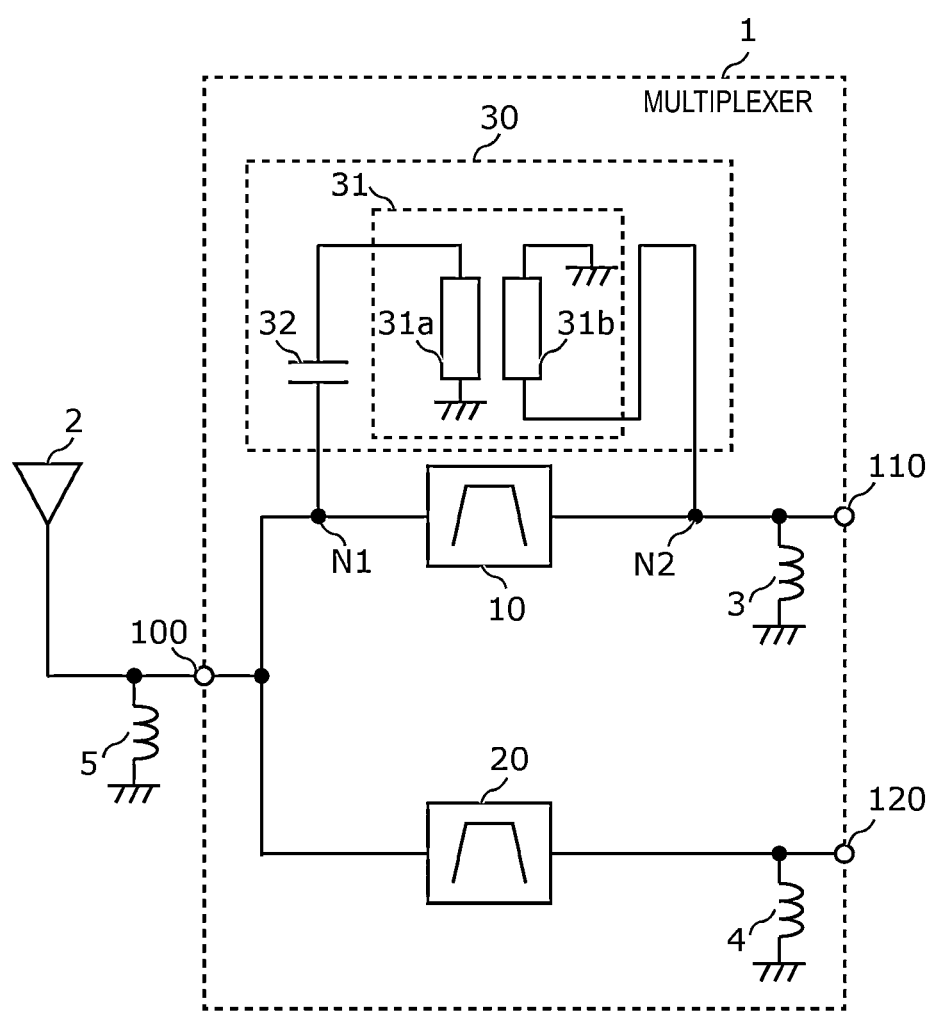
FIG. 1 is a view of the circuit configuration of a multiplexer according to a preferred embodiment of the present invention and a peripheral circuit of the multiplexer.

Hereinafter, preferred embodiments of the present disclosure will be described in detail by using the drawings. The preferred embodiments to be described later represent comprehensive or specific examples. Accordingly, a numerical value, a shape, a material, a component, the arrangement of the component, and the like described in the following preferred embodiments are examples and are not intended to limit the present invention.

Each drawing is a schematic view appropriately subjected to emphasis, omission, or ratio control to describe preferred embodiments of the present invention, is not necessarily strictly illustrated, and has a shape, a positional relationship, and a ratio different from actual ones on occasions. Substantially the same components are denoted by the same reference numerals throughout the drawings, and redundancy is omitted or simplified in some cases.

In the circuit configuration of the present disclosure, the term "connected" includes not only a case of being directly connected by using a connection terminal and/or a wiring conductor but also a case of being electrically connected with a different circuit element interposed therebetween. The phrase "connected between A and B" denotes being connected to both of A and B between A and B.

In addition, terms "parallel", "perpendicular", and the like representing a relationship between elements, a term representing the shape of an element such as the term "rectangular", and a numerical value range indicate not only strict meaning but also inclusion of substantially the same range, for example, an error of approximately several percent.

First Preferred Embodiment

1. Circuit Configuration of Multiplexer

FIG. 1 is a view of the circuit configuration of a multiplexer 1 according to a first preferred embodiment and a peripheral circuit of the multiplexer 1. FIG. 1 illustrates the multiplexer 1 according to this preferred embodiment, an antenna 2, and an inductor 5.

The multiplexer 1 includes a filter 10, a filter 20, an additional circuit 30, inductors 3 and 4, a common terminal 100, an input/output terminal 110 (a first input/output terminal), and an input/output terminal 120 (a second input/output terminal).

The filter 10 is an example of a first filter circuit, is connected between the common terminal 100 and the input/output terminal 110, and has a pass band including a first frequency band.

The filter 20 is an example of a second filter circuit, is connected between the common terminal 100 and the input/output terminal 120, and has a pass band including a second frequency band higher than the first frequency band.

The inductor 3 is an impedance matching element connected between the input/output terminal 110 and the ground. The inductor 4 is an impedance matching element connected between the input/output terminal 120 and the ground. The inductor 3 may be arranged in series with the input/output terminal 110 and the filter 10 and between the input/output terminal 110 and the filter 10. The inductor 4 may be arranged in series with the input/output terminal 120 and the filter 20 and between the input/output terminal 120 and the filter 20. In addition, the inductors 3 and 4 do not have to be provided.

The additional circuit 30 is connected in parallel to at least a portion of a path connecting the common terminal 100 and the input/output terminal 110. Specifically, the additional circuit 30 has one end connected to a node N1 on the path connecting the common terminal 100 and the input/output terminal 110 and the other end connected to a node N2 on the path.

The additional circuit 30 includes a longitudinally coupled resonator 31 and a capacitor 32. The longitudinally coupled resonator 31 includes surface acoustic wave resonators 31a and 31b and has one end (surface acoustic wave resonator 31a) connected to the capacitor 32 and the other end (surface acoustic wave resonator 31b) connected to the node N2. The capacitor 32 is connected between the surface acoustic wave resonator 31a and the node N1.

Each of the surface acoustic wave resonators 31a and 31b has a substrate having piezoelectricity and an IDT electrode formed on the substrate. The IDT electrode of the surface acoustic wave resonator 31a includes two comb-shaped electrodes facing each other. One of the comb-shaped electrodes is connected to the capacitor 32, and the other comb-shaped electrode is connected to the ground. The IDT electrode of the surface acoustic wave resonator 31b includes two comb-shaped electrodes facing each other. One of the comb-shaped electrodes is connected to the node N2, and the other comb-shaped electrode is connected to the ground. The IDT electrode of the surface acoustic wave resonator 31a and the IDT electrode of the surface acoustic wave resonator 31b are disposed parallel to each other in an acoustic wave propagation direction.

The longitudinally coupled resonator 31 may include reflectors disposed at both ends of the longitudinally coupled resonator 31 in the acoustic wave propagation direction.

The additional circuit 30 may also include a transversal surface acoustic wave resonator that transmits a signal by using propagation of a surface acoustic wave between two or more IDT electrodes, instead of the surface acoustic wave resonators 31a and 31b.

With the configuration described above, the additional circuit 30 generates a component with substantially the same amplitude as and in a substantially opposite phase from a component in a predetermined frequency band higher than or lower than the first frequency band for passing through the filter 10. The attenuation characteristic of the filter 10 in the predetermined frequency band may thereby be improved.

The nodes N1 and N2 to which the additional circuit 30 is connected is only required to be any node on the path connecting the common terminal 100 and the input/output terminal 110, and the nodes N1 and N2 may be disposed with at least one serial arm resonator of the filter 10 interposed therebetween.

In addition, in this preferred embodiment, the node N1 and the node N2 are two different nodes. The term "two different nodes" denotes two nodes connected to each other with an impedance element (such as an inductor, a capacitor, a resistor, or a resonator) interposed therebetween.

The capacitor 32 does not have to be provided, and one end of the surface acoustic wave resonator 31a may be directly connected to the node N1. In addition, a capacitor may be connected between one end of the surface acoustic wave resonator 31b and the node N2.

2. Multiplexer 1 according to Preferred Embodiment Example 1

The multiplexer 1 according to Preferred Embodiment Example 1 will then be described. The multiplexer 1 according to Preferred Embodiment Example 1 has the same configuration as the configuration illustrated in FIG. 1 and includes the filter 10, the filter 20, the additional circuit 30, the inductors 3 and 4, the common terminal 100, the input/output terminal 110 (a first input/output terminal), and the input/output terminal 120 (a second input/output terminal).

In the multiplexer 1 according to Preferred Embodiment Example 1, a restriction that the pass band for the filter 10 is located lower than the pass band for the filter 20 is added to the multiplexer 1 according to the preferred embodiment.

Figure 2A:
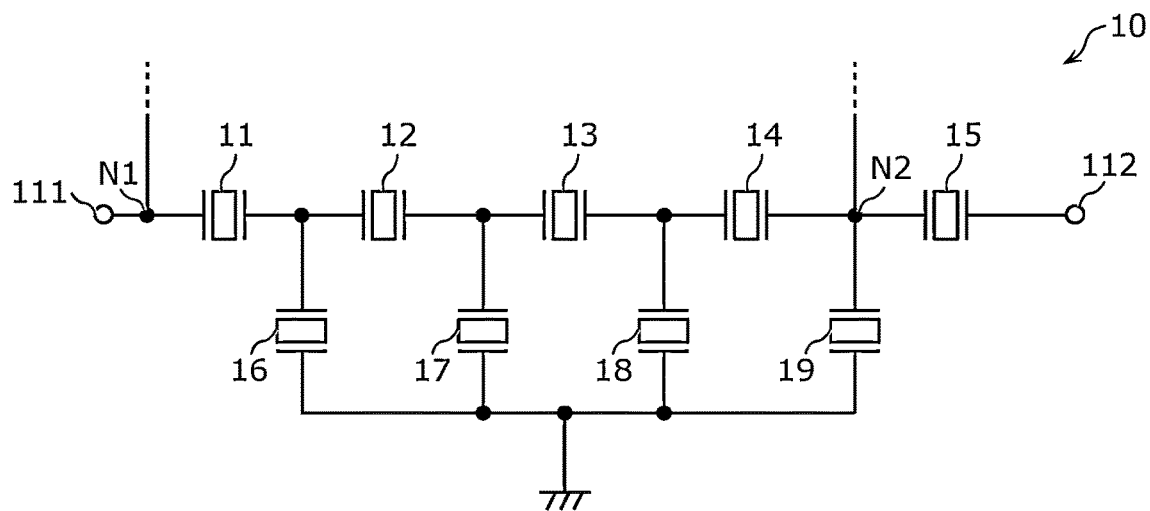
FIG. 2A is a view of a circuit configuration of a first filter circuit according to Example 1 of a preferred embodiment of the present invention.

FIG. 2A is a view of the circuit configuration of the filter 10 according to Preferred Embodiment Example 1.

The filter 10 is an example of the first filter circuit, is a ladder acoustic wave filter circuit including a plurality of surface acoustic wave resonators, and includes serial arm resonators 11, 12, 13, 14, and 15 and parallel arm resonators 16, 17, 18, and 19. The serial arm resonators 11 to 15 are disposed on a serial arm path connecting a terminal 111 and a terminal 112. Each of the parallel arm resonators 16 to 19 is connected between the serial arm path and the ground. Each of the serial arm resonators 11 to 15 and the parallel arm resonators 16 to 19 is a surface acoustic wave resonator that includes, for example, a Y-cut LiNbO3 piezoelectric substrate and an IDT electrode formed on the piezoelectric substrate and that uses a Rayleigh wave.

With the configuration described above, the filter 10 uses, as a pass band (the first frequency band), an uplink operation band (about 703 MHz to about 748 MHz) of, for example, the band B28 for long term evolution (LTE) or the band n28 for 5th generation (5G)-new radio (NR).

In this preferred embodiment example, one end of the additional circuit 30 is connected to the node N1 between the terminal 111 and a serial arm resonator 11, and the other end of the additional circuit 30 is connected to the node N2 between the serial arm resonator 14 and the serial arm resonator 15.

A circuit configuration of the first filter circuit according to preferred embodiments of the present invention is not limited to the circuit configuration of the filter 10 illustrated in FIG. 2A.

Figure 2B:
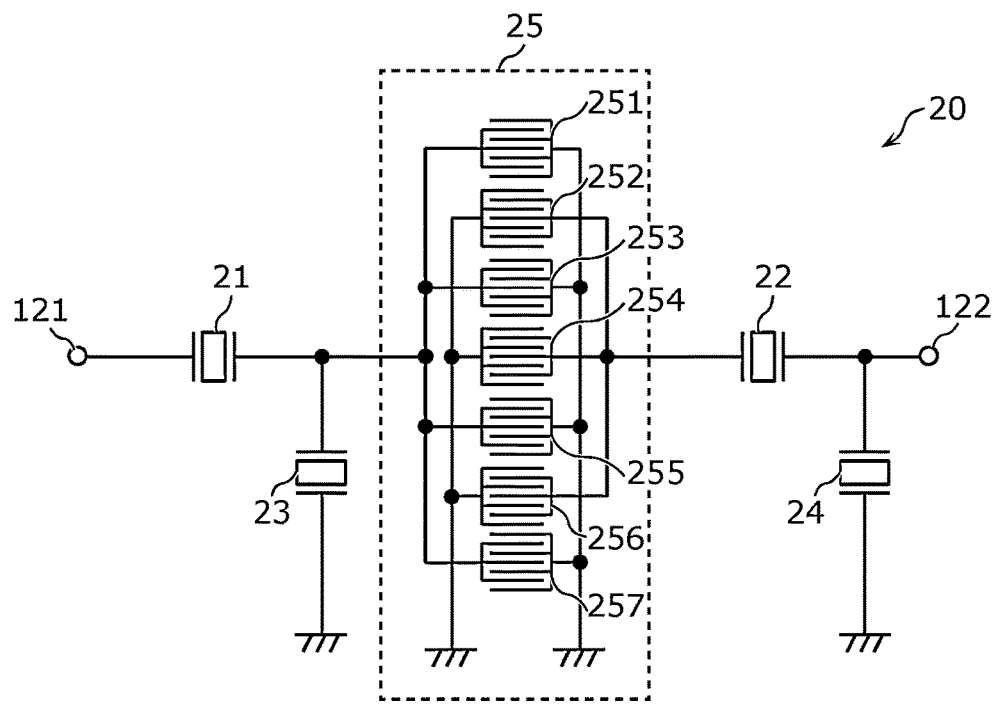
FIG. 2B is a view of the circuit configuration of a second filter circuit according to Example 1 of a preferred embodiment of the present invention.

FIG. 2B is a view of the circuit configuration of the filter 20 according to Preferred Embodiment Example 1.

The filter 20 is an example of the second filter circuit, is an acoustic wave filter circuit including a longitudinally coupled resonator 25 including seven surface acoustic wave resonators, and includes the longitudinally coupled resonator 25, serial arm resonators 21 and 22, and parallel arm resonators 23 and 24.

The longitudinally coupled resonator 25 includes surface acoustic wave resonators 251, 252, 253, 254, 255, 256, and 257 and has one end connected to a terminal 121 with the serial arm resonator 21 interposed therebetween and the other end connected to a terminal 122 with the serial arm resonator 22 interposed therebetween.

Each of the surface acoustic wave resonators 251 to 257 has a substrate having piezoelectricity and an IDT electrode formed on the substrate. The IDT electrode of each of the surface acoustic wave resonators 251, 253, 255, and 257 includes two comb-shaped electrodes facing each other. One of the comb-shaped electrodes of each of the surface acoustic wave resonators 251, 253, 255, and 257 is connected to the terminal 121 with the serial arm resonator 21 interposed therebetween, and the other comb-shaped electrode of each of the surface acoustic wave resonators 251, 253, 255, and 257 is connected to the ground. One of the comb-shaped electrodes of each of the surface acoustic wave resonators 252, 254, and 256 is connected to the terminal 122 with the serial arm resonator 22 interposed therebetween, and the other comb-shaped electrode of each of the surface acoustic wave resonators 252, 254, and 256 is connected to the ground. The surface acoustic wave resonators 251 to 257 are arranged in the acoustic wave propagation direction in the order of the surface acoustic wave resonators 251, 252, 253, 254, 255, 256, and 257.

The serial arm resonators 21 and 22 are disposed on the serial arm path connecting the terminals 121 and 122. Each of the parallel arm resonators 23 and 24 is connected between the serial arm path and the ground.

Each of the surface acoustic wave resonators 251 to 257, the serial arm resonators 21 and 22, and the parallel arm resonators 23 and 24 is a surface acoustic wave resonator that includes, for example, a Y-cut LiNbO₃ piezoelectric substrate and an IDT electrode formed on the piezoelectric substrate and that uses a Rayleigh wave.

With the configuration described above, the filter 20 uses, as a pass band (the second frequency band), a downlink operation band (about 758 MHz to about 803 MHz) of, for example, the band B28 for LTE or the band n28 for 5G-NR.

A circuit configuration of the second filter circuit according to preferred embodiments of the present invention is not limited to the circuit configuration of the filter 20 illustrated in FIG. 2B.

Figure 3:
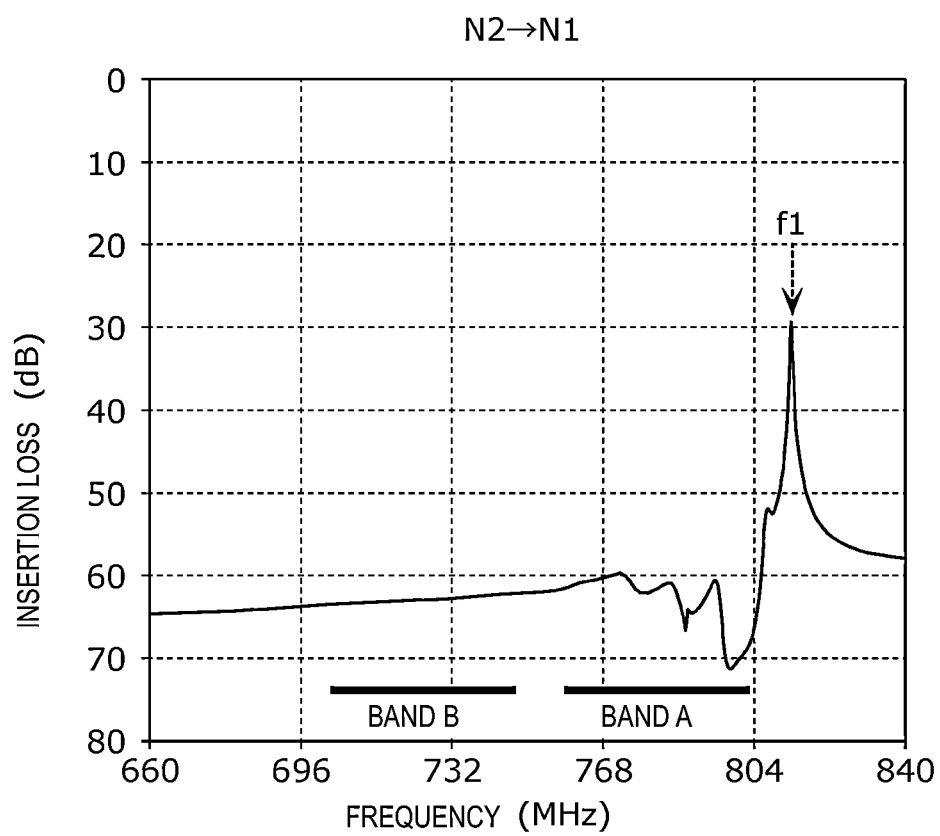
FIG. 3 is a graph representing a bandpass characteristic of an additional circuit according to Example 1 of a preferred embodiment of the present invention.

FIG. 3 is a graph representing a bandpass characteristic of the additional circuit 30 according to Preferred Embodiment Example 1. FIG. 3 illustrates the bandpass characteristic of the additional circuit 30 in passing from the node N2 to the node N1. A band B illustrated in FIG. 3 is the first frequency band, and a band A is the second frequency band. In the additional circuit 30, the amplitude level and the phase level of the component in the band A are set to prevent the component in the band A by the filter 10. At this time, a response (hereinafter, referred to as an IDT response) attributed to the IDT electrodes of the longitudinally coupled resonator 31 occurs at a frequency higher than the band A. In a case where a peak frequency in the IDT response is f1, the peak frequency f1 in the IDT response is about 812.7 MHz in this preferred embodiment example. The peak frequency in the IDT response in this preferred embodiment example is a frequency corresponding to the minimum insertion loss among frequencies higher than the second frequency band in the bandpass characteristic of the additional circuit 30.

The IDT response attributed to the IDT electrodes of the longitudinally coupled resonator 31 causes the deterioration in the attenuation characteristic of the filter 10 at the frequency higher than the band A.

In contrast, in the multiplexer 1 according to this preferred embodiment example, the attenuation characteristic of the multiplexer 1 is improved by substantially matching the peak frequency f1 in the IDT response and the low impedance frequency in the band higher than the second frequency for the multiplexer 1.

Figure 4:
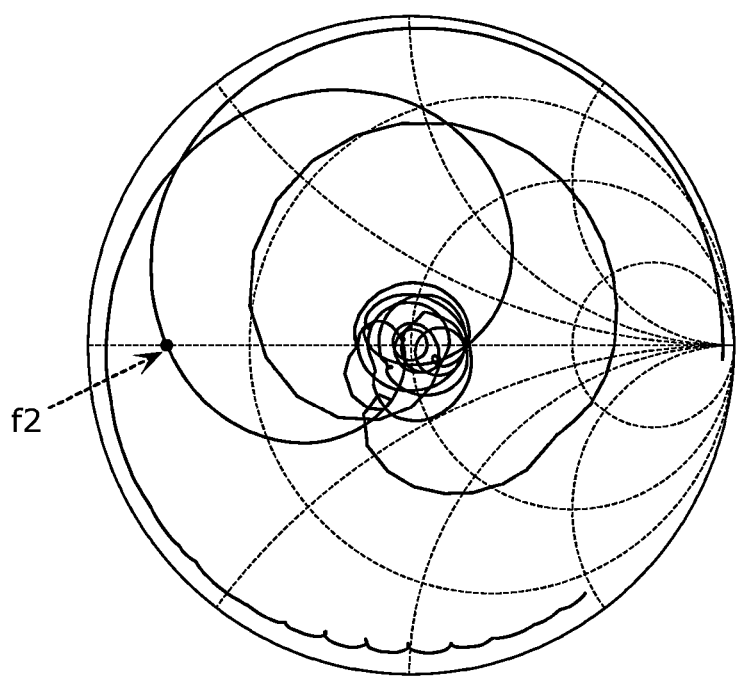
FIG. 4 is a Smith chart representing impedance at the time of viewing the multiplexer according to Example 1 of a preferred embodiment of the present invention from a common terminal.

FIG. 4 is a Smith chart representing impedance at the time of viewing the multiplexer 1 according to Preferred Embodiment Example 1 from the common terminal 100. The Smith chart in FIG. 4 illustrates the impedance at the time of viewing the filters 10 and 20 and the additional circuit 30 from the common terminal 100. In FIG. 4, impedances in the pass band for the filter 10 (band B) and the pass band for the filter 20 (band A) are located near the reference impedance (50Ω). In contrast, FIG. 4 illustrates a frequency f2 corresponding to the lowest impedance among frequencies higher than the pass band for the filter 20 (band A: the second frequency band). In the Smith chart in FIG. 4, the impedance at the frequency f2 is thus located in the lower impedance part on the real axis (where the reactance component is zero).

In this preferred embodiment example, the peak frequency f1 in the IDT response described above is substantially matched with the frequency f2 corresponding to the lowest impedance. Specifically, the peak frequency f1 may be substantially matched with the frequency f2 by controlling, for example, the pitch of each IDT electrode of the longitudinally coupled resonator 31 included in the additional circuit 30.

The pitch of the IDT electrode is about ½ of a wavelength λ of the IDT electrode, for example. The wavelength λ of the IDT electrode is a repetition period of a plurality of electrode fingers of the pair of comb-shaped electrodes included in the IDT electrode.

Figure 5:
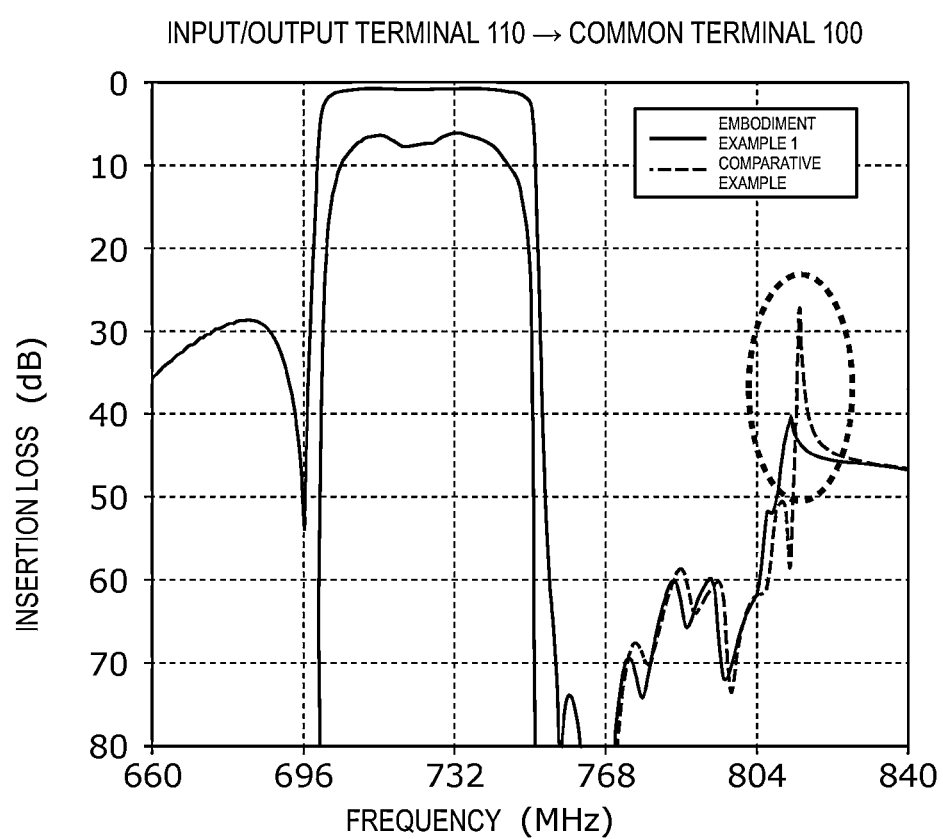
FIG. 5 illustrates bandpass characteristics of the first filter circuit and the additional circuit according to Example 1 of a preferred embodiment of the present invention and those according to Comparative Example.

FIG. 5 illustrates bandpass characteristics of the filter 10 and the additional circuit 30 according to Preferred Embodiment Example 1 and those according to Comparative Example. FIG. 5 illustrates the respective bandpass characteristics of the multiplexer according to Preferred Embodiment Example 1 and that according to Comparative Example in passing from the input/output terminal 110 to the common terminal 100.

The multiplexer according to Comparative Example has the circuit configuration illustrated in FIGS. 1, 2A, and 2B; however, the peak frequency f1 is 2.2 MHz away from the frequency f2.

As illustrated in FIG. 5, it is understood that as compared with the multiplexer according to Comparative Example, attenuation occurring at a frequency higher than the band A (second frequency band) is improved (the response peak is lowered) (the broken line circle in FIG. 5) in the multiplexer 1 according to Preferred Embodiment Example 1 in the bandpass characteristic of the filter 10 and the additional circuit 30.

This is understood for the following reason. In a case where a signal with a frequency close to the peak frequency f1 in the response is input from the common terminal 100, substantially matching the peak frequency f1 and the frequency f2 results in lower impedance in the filter 20 or 10 at the peak frequency f1. The signal with the frequency close to the peak frequency f1 flows toward the filter 20 but does not flow to the filter 10, or the signal with the frequency close to the peak frequency f1 is consumed in the filter 10 and thus does not flow to the input/output terminal 110.

That is, by substantially matching the peak frequency f1 in the IDT response and the frequency f2 corresponding to the lowest impedance in the multiplexer 1, an IDT response occurring in the filter 10 (and the additional circuit 30) and at a frequency higher than the band A (second frequency band) may be prevented, and thus the attenuation may be improved.

3. Degree of Coincidence between Frequency f1 and Frequency f2

The degree of coincidence between the peak frequency f1 in the IDT response and the frequency f2 corresponding to the lowest impedance in the multiplexer 1 will then be described.

Figures 6A, 6B:
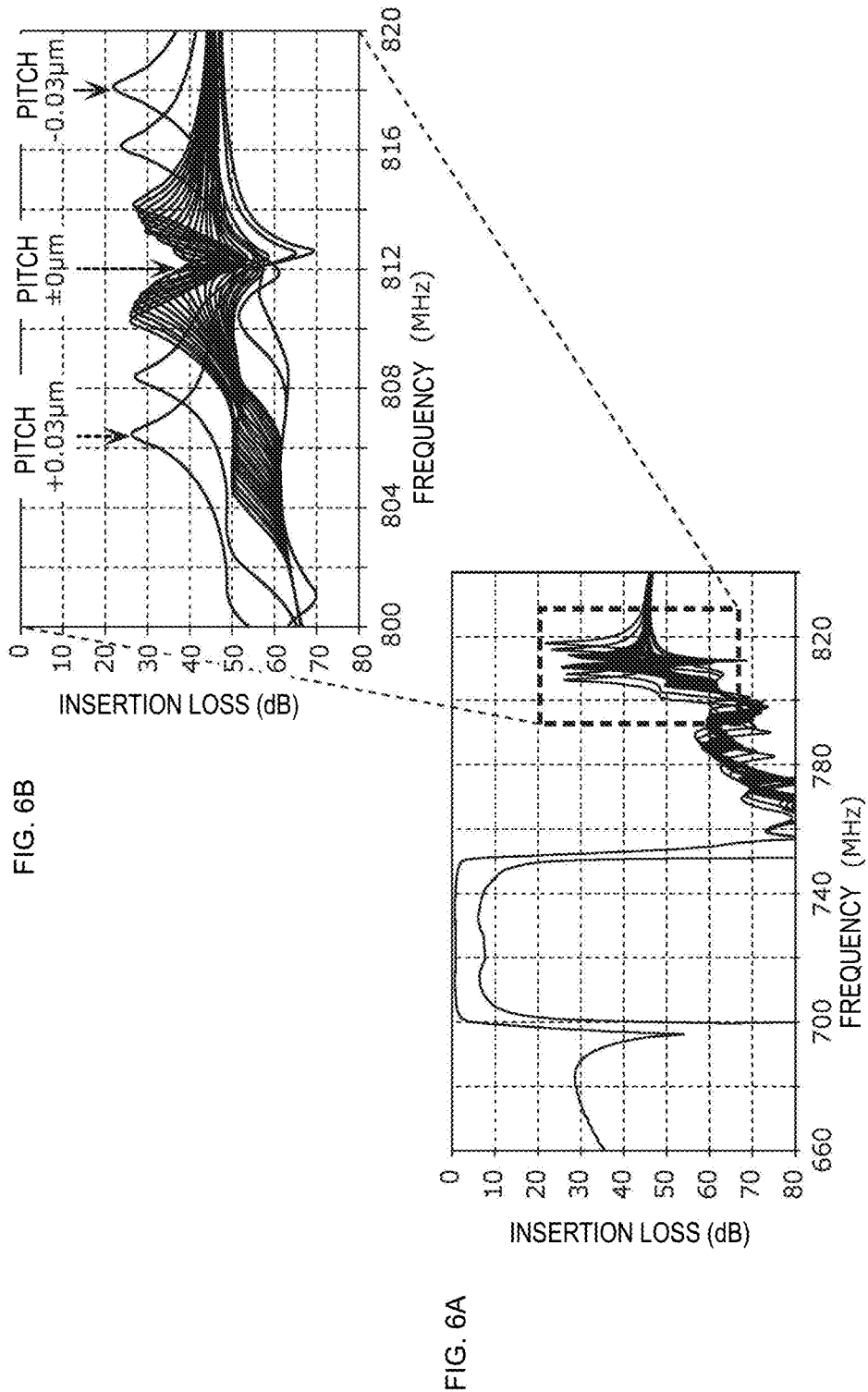
FIGS. 6A and 6B illustrate bandpass characteristics of the first filter circuit and the additional circuit at the time when the IDT electrode pitch of the additional circuit is changed.

FIGS. 6A and 6B illustrate bandpass characteristics of the filter 10 and the additional circuit 30 at the time when the IDT electrode pitch of the additional circuit 30 is changed. FIGS. 66A and 6B illustrate, a bandpass characteristic in passing from the input/output terminal 110 to the common terminal 100 at the time when the peak frequency f1 is changed stepwise with respect to the frequency f2. In particular, in FIG. 6B, the bandpass characteristics in an area of frequencies higher than the band A (second frequency band) are enlarged. In changing the frequency f1, the pitch of the IDT electrode of the longitudinally coupled resonator 31 is changed in a range of about 0.06 μm (from about −0.03 μm to about +0.03 μm), for example.

As illustrated in FIG. 6B, changing the pitch of the IDT electrode of the longitudinally coupled resonator 31 leads to changes in the peak frequency f1, a frequency difference between the frequency f2 (about 812.7 MHz) and the peak frequency f1 is changed with the changes, and the peak value of the IDT response is increased and decreased due to the frequency difference changes.

Figure 7:
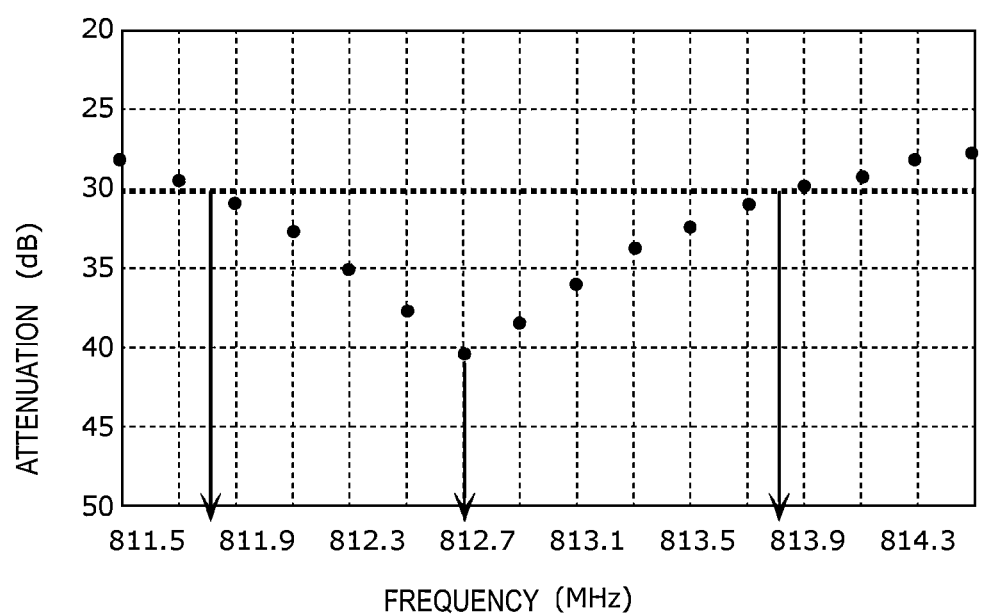
FIG. 7 is a graph representing attenuation at the time when the peak frequency in an IDT response is changed with respect to a frequency corresponding to the lowest impedance among frequencies higher than a second frequency band of the multiplexer.

FIG. 7 is a graph representing attenuation at the time when the peak frequency f1 in the IDT response is changed with respect to the frequency f2 (about 812.7 MHz) corresponding to the lowest impedance among frequencies higher than the band A (second frequency band) of the multiplexer 1. The horizontal axis represents the frequency f1, and the vertical axis represents attenuation (the worst value) of the filter 10 and the additional circuit 30, the attenuation being associated with a frequency higher than the band A.

As illustrated in FIG. 7, changing the peak frequency f1 leads to the changes in the attenuation; however, when the peak frequency f1 substantially matches the frequency f2, the attenuation has the maximum value (about 40 dB).

If the required value of the attenuation is about 30 dB, for example, 811.7 MHz≤f1≤813.7 MHz (Formula 1) is required to be satisfied. That is, f1 is required to be within a range of f2±1 MHz with respect to f2=812.7 MHz.

When being expressed on the basis of the frequency f2, Formula 1 may be expressed as Formula 2 and consequently as Formula 3.

$$f2 \times (1 - 1 \text{ MHz}/812.7 \text{ MHz}) \leq f1 \leq f2 \times (1 + 1 \text{ MHz}/813.7 \text{ MHz}) \quad \text{(Formula 2)}$$

$$f2 \times (1 - 0.0012) \leq f1 \leq f2 \times (1 + 0.0012) \quad \text{(Formula 3)}$$

According to this, substantially matching the peak frequency f1 in the IDT response and the frequency f2 corresponding to the lowest impedance in the multiplexer 1 as expressed by Formula 3 enables prevention of the IDT response occurring in the filter 10 (and the additional circuit 30) and at a frequency higher than the band A (second frequency band). As the result, the attenuation may be improved, and about 30 dB attenuation may be ensured, for example.

The required value (about 30 dB) of the attenuation is out-of-pass-band attenuation required for a filter included in a wireless communication front-end circuit of a mobile communication terminal such as a mobile phone.

If the required value of the attenuation is about 35 dB, for example, 812.25 MHz≤f1≤813.15 MHz (Formula 4) is required to be satisfied. That is, f1 is required to be within a range of f2±0.45 MHz with respect to f2=812.7 MHz.

When being expressed on the basis of the frequency f2, Formula 4 may be expressed as Formula 5 and consequently as Formula 6.

$$f2\times(1-0.45\text{ MHz}/812.7\text{ MHz}) \leq f1 \leq f2\times(1+0.45\text{ MHz}/813.7\text{ MHz}) \quad \text{(Formula 5)}$$

$$f2\times(1-0.00055) \leq f1 \leq f2\times(1+0.00055) \quad \text{(Formula 6)}$$

According to this, substantially matching the peak frequency f1 in the IDT response and the frequency f2 corresponding to the lowest impedance in the multiplexer 1 as expressed by Formula 6 enables prevention of the IDT response occurring in the filter 10 (and the additional circuit 30) and at a frequency higher than the band A (second frequency band). As the result, the attenuation may be improved, and about 35 dB attenuation may be ensured.

In the multiplexer 1 according to this preferred embodiment example, the pass band for the filter 10 is required to be lower than the pass band for the filter 20. However, the band applied to the filters 10 and 20 is not limited to the band B28 for LTE or the band n28 for 5G-NR.

The band applied to the filters 10 and 20 may be, for example, the band B2 for LTE or the band n2 for 5G-NR. The filter 10 is thus applied to a filter using an uplink operation band (about 1850 MHz to about 1910 MHz) of the band B2 or the band n2 as the pass band (first frequency band), and the filter 20 is applied to a filter using a downlink operation band (about 2110 MHz to about 2170 MHz) of the band B2 or the band n2 as the pass band (second frequency band). Also in this case, satisfying Formula 3 leads to the prevention of an IDT response occurring at a frequency higher than the second frequency band and enables about 30 dB to be ensured as the attenuation at a frequency higher than the second frequency band. In addition, satisfying Formula 6 leads to the prevention of the IDT response occurring at a frequency higher than the second frequency band and enables about 35 dB to be ensured as the attenuation at a frequency higher than the second frequency band.

The band applied to the filters 10 and 20 may also be, for example, the band B7 for LTE or the band n7 for 5G-NR. The filter 10 is thus applied to a filter using an uplink operation band (about 2500 MHz to about 2570 MHz) of the band B7 or the band n7 as the pass band (first frequency band), and the filter 20 is applied to a filter using a downlink operation band (about 2620 MHz to about 2690 MHz) of the band B7 or the band n7 as the pass band (second frequency band). Also in this case, satisfying Formula 3 leads to the prevention of the IDT response occurring at a frequency higher than the second frequency band and enables about 30 dB to be ensured as the attenuation at a frequency higher than the second frequency band. In addition, satisfying Formula 6 leads to the prevention of the IDT response occurring at a frequency higher than the second frequency band and enables about 35 dB to be ensured as the attenuation at a frequency higher than the second frequency band.

If the filters 10 and 20 are a surface acoustic wave filter, the substrate having piezoelectricity is an Y-cut $LiNbO_3$ piezoelectric substrate and does not have to be the substrate using a Rayleigh wave. The piezoelectric substrate may be, for example, a $LiTaO_3$ piezoelectric substrate using a Leaky wave.

The substrate having piezoelectricity may also have a structure in which a high-acoustic-velocity supporting substrate, a low-acoustic-velocity film, and a piezoelectric film are stacked in this order and may also have a structure in which a supporting substrate, an energy confinement layer, and a piezoelectric film are stacked in this order.

In this preferred embodiment example, the filter 10 is not limited to the ladder surface acoustic wave filter. The filter 10 may have a structure of a type other than the ladder type and may be a bulk acoustic wave filter. Further, the filter 10 may be an LC filter including an inductor and a capacitor. The filter 20 is not limited to the longitudinally coupled surface acoustic wave filter. The filter 20 may have a structure other than the structure of the longitudinally coupling type and may also be a bulk acoustic wave filter. Further, the filter 20 may also be an LC filter including an inductor and a capacitor.

The number of surface acoustic wave resonators included in the longitudinally coupled resonator 31 of the additional circuit 30 may be 3 or more.

4. Multiplexer 1A according to Preferred Embodiment Example 2

A multiplexer 1A according to Preferred Embodiment Example 2 will then be described. The multiplexer 1A according to Preferred Embodiment Example 2 has the same configuration as the configuration illustrated in FIG. 1 and includes a filter 10A, a filter 20A, the additional circuit 30, the inductors 3 and 4, the common terminal 100, the input/output terminal 110 (first input/output terminal), and the input/output terminal 120 (second input/output terminal).

In the multiplexer 1A according to Preferred Embodiment Example 2, a restriction that the pass band for the filter 10 is located higher than the pass band for the filter 20 is added to the multiplexer 1 according to the present preferred embodiment.

Figure 8A:
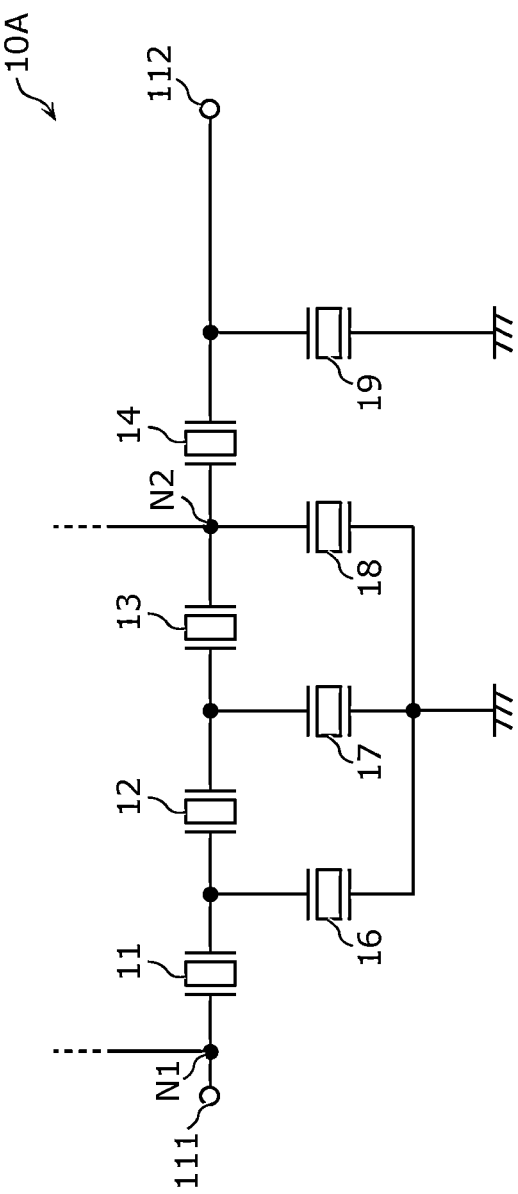
FIG. 8A is a view of the circuit configuration of a first filter circuit according to Example 2 of a preferred embodiment of the present invention.

FIG. 8A is a view of the circuit configuration of the filter 10A according to Preferred Embodiment Example 2.

The filter 10A is an example of a first filter circuit, is a ladder acoustic wave filter circuit including a plurality of surface acoustic wave resonators, and includes the serial arm resonators 11, 12, 13, and 14 and the parallel arm resonators 16, 17, 18, and 19. The serial arm resonators 11 to 14 are disposed on the serial arm path connecting the terminal 111 and the terminal 112. Each of the parallel arm resonators 16 to 19 is connected between the serial arm path and the ground. Each of the serial arm resonators 11 to 14 and the parallel arm resonators 16 to 19 is a surface acoustic wave resonator that includes, for example, a Y-cut $LiNbO_3$ piezoelectric substrate and an IDT electrode formed on the piezoelectric substrate and that uses a Rayleigh wave.

With the configuration described above, the filter 10A uses, as the pass band (first frequency band), an uplink operation band (about 663 MHz to about 698 MHz) of, for example, the band B71 for LTE or the band n71 for 5G-NR.

In this preferred embodiment example, one end of the additional circuit 30 is connected to the node N1 between the terminal 111 and the serial arm resonator 11, and the other end of the additional circuit 30 is connected to a node N2 between the serial arm resonator 13 and the serial arm resonator 14.

A circuit configuration of the first filter circuit according to preferred embodiments of the present invention is not limited to the circuit configuration of the filter 10A illustrated in FIG. 8A.

Figure 8B:
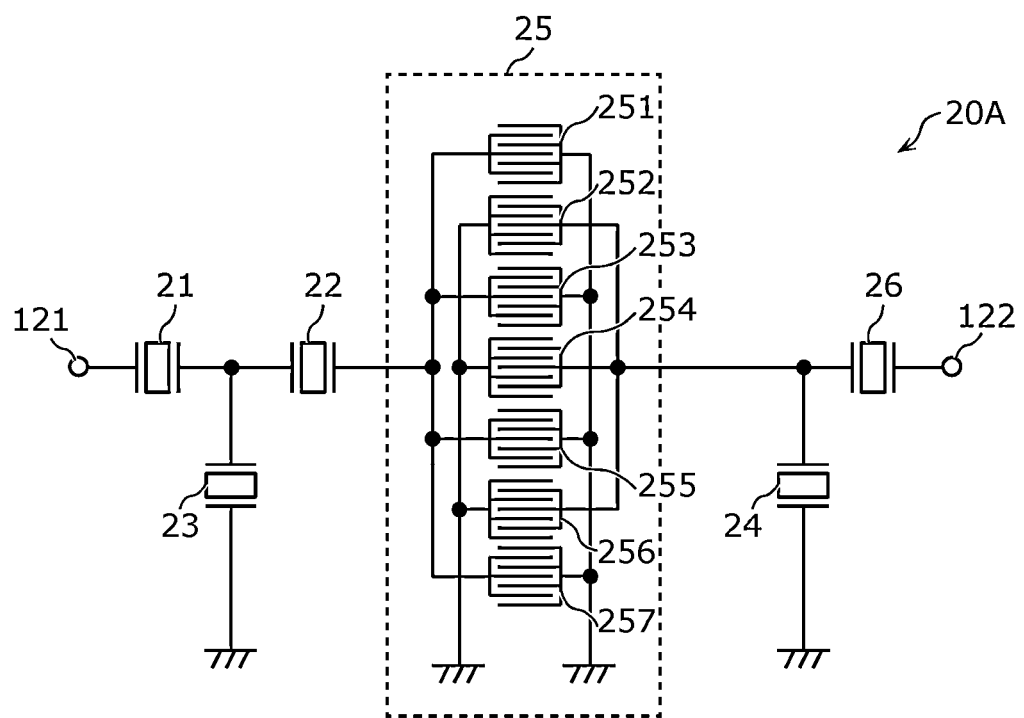
FIG. 8B is a view of the circuit configuration of a second filter circuit according to Example 2 of a preferred embodiment of the present invention.

FIG. 8B is a view of the circuit configuration of the filter 20A according to Preferred Embodiment Example 2.

The filter 20A is an example of a second filter circuit, is an acoustic wave filter circuit including the longitudinally coupled resonator 25 including seven surface acoustic wave resonators, and includes the longitudinally coupled resonator 25, the serial arm resonators 21 and 22, a serial arm resonator 26, and the parallel arm resonators 23 and 24.

The longitudinally coupled resonator 25 includes the surface acoustic wave resonators 251, 252, 253, 254, 255, 256, and 257 and has one end connected to the terminal 121 with the serial arm resonators 21 and 22 interposed therebetween and the other end connected to the terminal 122 with the serial arm resonator 26 interposed therebetween.

Each of the surface acoustic wave resonators 251 to 257 has a substrate having piezoelectricity and an IDT electrode formed on the substrate. The IDT electrode of each of the surface acoustic wave resonators 251, 253, 255, and 257 includes two comb-shaped electrodes facing each other. One of the comb-shaped electrodes of each of the surface acoustic wave resonators 251, 253, 255, and 257 is connected to the terminal 121 with the serial arm resonators 21 and 22 interposed therebetween, and the other comb-shaped electrode of each of the surface acoustic wave resonators 251, 253, 255, and 257 is connected to the ground. One of the comb-shaped electrodes of each of the surface acoustic wave resonators 252, 254, and 256 is connected to the terminal 122 with the serial arm resonator 26 interposed therebetween, and the other comb-shaped electrode of each of the surface acoustic wave resonators 252, 254, and 254 is connected to the ground. The surface acoustic wave resonators 251 to 257 are arranged in the acoustic wave propagation direction in the order of the surface acoustic wave resonators 251, 252, 253, 254, 255, 256, and 257.

The serial arm resonators 21, 22, and 26 are disposed on the serial arm path connecting the terminals 121 and 122. Each of the parallel arm resonators 23 and 24 is connected between the serial arm path and the ground.

Each of the surface acoustic wave resonators 251 to 257, the serial arm resonators 21, 22, and 26, and the parallel arm resonators 23 and 24 is a surface acoustic wave resonator that includes, for example, a Y-cut $LiNbO_3$ piezoelectric substrate and an IDT electrode formed on the piezoelectric substrate and that uses a Rayleigh wave.

With the configuration described above, the filter 20A uses, as a pass band (second frequency band), a downlink operation band (about 617 MHz to about 652 MHz) of, for example, the band B71 for LTE or the band n71 for 5G-NR.

Figure 9:
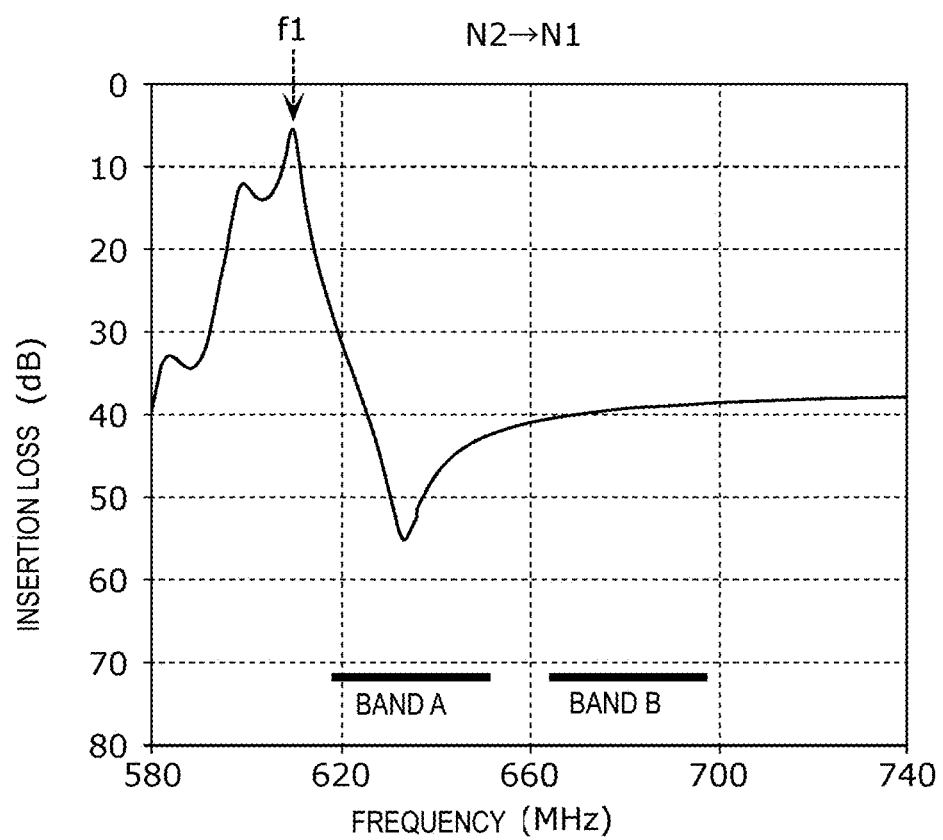
FIG. 9 is a graph representing a bandpass characteristic of the additional circuit according to Example 2 of a preferred embodiment of the present invention.

FIG. 9 is a graph representing a bandpass characteristic of the additional circuit 30 according to Preferred Embodiment Example 2. FIG. 9 illustrates the bandpass characteristic of the additional circuit 30 in passing from the node N2 to the node N1. The band B illustrated in FIG. 9 is the first frequency band, and the band A is the second frequency band. In the additional circuit 30, the amplitude level and the phase level in the component in the band A are set to prevent the component in the band A by the filter 10A. At this time, an IDT response attributed to the IDT electrodes of the longitudinally coupled resonator 31 occurs at a frequency lower than the band A. In a case where the peak frequency in the IDT response is f1, the peak frequency f1 in the IDT response is about 610 MHz in this preferred embodiment example. The peak frequency in the IDT response in this preferred embodiment example is a frequency corresponding to the minimum insertion loss among frequencies lower than the second frequency band in the bandpass characteristic of the additional circuit 30.

The IDT response attributed to the IDT electrodes of the longitudinally coupled resonator 31 causes the deterioration in the attenuation characteristic of the filter 10A at the frequency lower than the band A.

In contrast, in the multiplexer 1A according to this preferred embodiment example, the attenuation characteristic of the multiplexer 1A is improved by substantially matching the peak frequency f1 in the IDT response and the low impedance frequency in the band lower than the second frequency for the multiplexer 1A.

Figure 10:
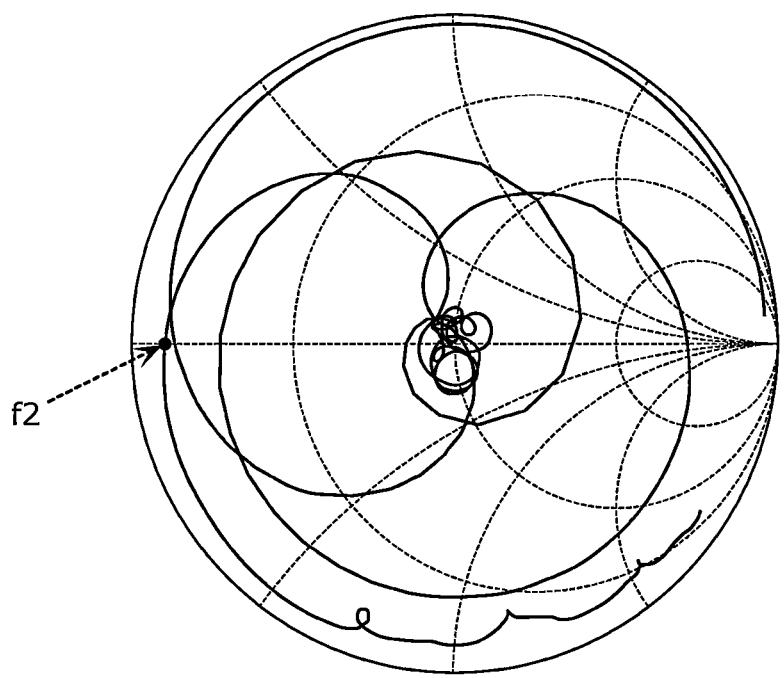
FIG. 10 is a Smith chart representing impedance at the time of viewing a multiplexer according to Example 2 of a preferred embodiment of the present invention from the common terminal.

FIG. 10 is a Smith chart representing impedance at the time of viewing the multiplexer 1A according to Preferred Embodiment Example 2 from the common terminal 100. The Smith chart in FIG. 10 illustrates the impedance at the time of viewing the filters 10A and 20A and the additional circuit 30 from the common terminal 100. In FIG. 10, impedances in the pass band for the filter 10A (band B) and the pass band for the filter 20A (band A) are located near the reference impedance (about 50Ω). In contrast, FIG. 10 illustrates the frequency f2 corresponding to the lowest impedance among frequencies lower than the pass band for the filter 20A (band A: the second frequency band). In the Smith chart in FIG. 10, the impedance at the frequency f2 is thus located in the lower impedance portion on the real axis (where the reactance component is zero).

In this preferred embodiment example, the peak frequency f1 in the IDT response described above is substantially matched with the frequency f2 corresponding to the lowest impedance. Specifically, the peak frequency f1 may be substantially matched with the frequency f2 by controlling, for example, the pitch of each IDT electrode of the longitudinally coupled resonator 31 included in the additional circuit 30.

Figure 11:
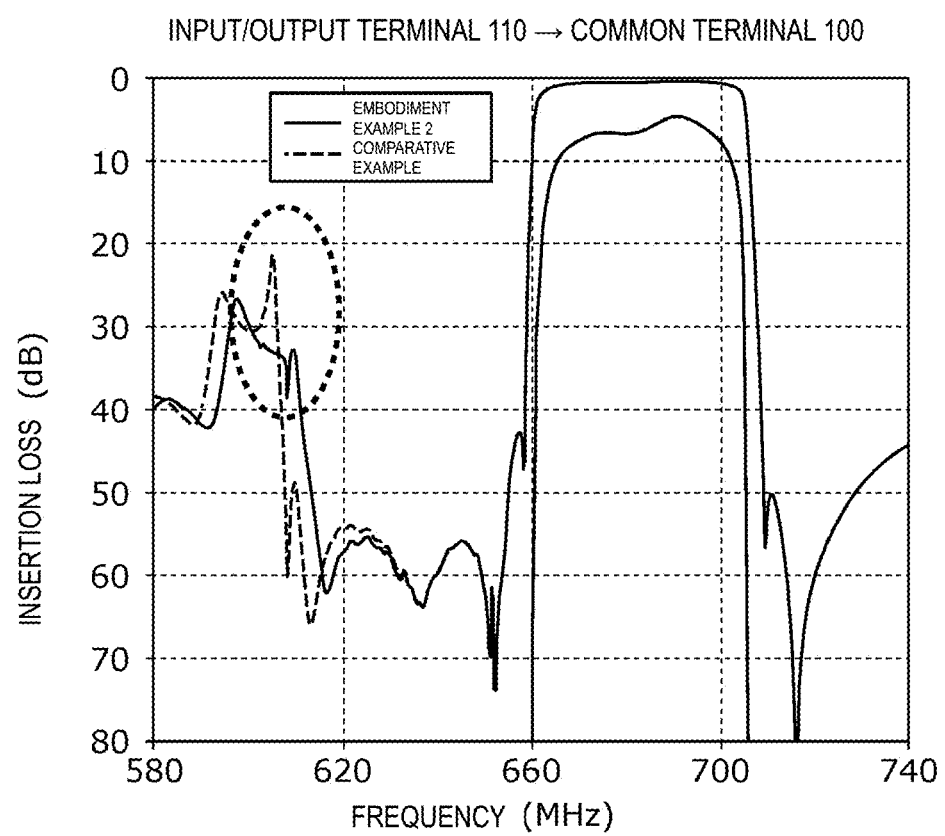
FIG. 11 illustrates bandpass characteristics of the first filter circuit and the additional circuit according to Example 2 of a preferred embodiment of the present invention and those according to Comparative Example.

FIG. 11 illustrates bandpass characteristics of the filter 10A and the additional circuit 30 according to Preferred Embodiment Example 2 and those according to Comparative Example. FIG. 11 illustrates the respective bandpass characteristics of the multiplexer according to Preferred Embodiment Example 2 and that according to Comparative Example in passing from the input/output terminal 110 to the common terminal 100.

The multiplexer according to Comparative Example has the circuit configuration illustrated in FIGS. 1, 8A, and 8B; however, the peak frequency f1 is about 3.2 MHz away from the frequency f2.

As illustrated in FIG. 11, it is understood that as compared with the multiplexer according to Comparative Example, attenuation occurring at a frequency lower than the band A (second frequency band) is improved (the response peak is lowered) (the broken line circle in FIG. 11) in the multiplexer 1A according to Preferred Embodiment Example 2 in the bandpass characteristic of the filter 10A and the additional circuit 30.

This is understood for the following reason. In a case where a signal with a frequency close to the peak frequency f1 in the response is input from the common terminal 100, substantially matching the peak frequency f1 and the frequency f2 results in lower impedance in the filter 20A or 10A at the peak frequency f1. The signal with the frequency close to the peak frequency f1 flows toward the filter 20A but does not flow to the filter 10A, or the signal with the frequency close to the peak frequency f1 is consumed in the filter 10A and thus does not flow to the input/output terminal 110.

That is, by substantially matching the peak frequency f1 in the IDT response and the frequency f2 corresponding to the lowest impedance in the multiplexer 1A, an IDT response occurring in the filter 10A (and the additional circuit 30) and at a frequency lower than the band A (second frequency band) may be prevented, and thus the attenuation may be improved.

Also in the multiplexer 1A according to this preferred embodiment example, the same relationship as the relationship between the peak frequency f1 and the frequency f2 illustrated in FIG. 7 holds true.

That is, if the required value of the attenuation in the filter 10A and the additional circuit 30 and at a frequency lower than the band A is about 30 dB, Formula 3 is required to be satisfied.

According to this, substantially matching the peak frequency f1 in the IDT response and the frequency f2 corresponding to the lowest impedance in the multiplexer 1A as expressed by Formula 3 enables prevention of the IDT response occurring in the filter 10A (and the additional circuit 30) and at a frequency lower than the band A (second frequency band). As the result, the attenuation may be improved, and about 30 dB attenuation may be ensured.

If the required value of the attenuation is about 35 dB, Formula 6 is required to be satisfied.

According to this, substantially matching the peak frequency f1 in the IDT response and the frequency f2 corresponding to the lowest impedance in the multiplexer 1A as expressed by Formula 6 enables prevention of the IDT response occurring in the filter 10A (and the additional circuit 30) and at a frequency lower than the band A (second frequency band). As the result, the attenuation may be improved, and 35 dB may be ensured.

In the multiplexer 1A according to this preferred embodiment example, the pass band for the filter 10A is required to be higher than the pass band for the filter 20A; however, the band applied to the filters 10A and 20A is not limited to the band B71 for LTE.

If the filters 10A and 20A are a surface acoustic wave filter, the substrate having piezoelectricity is an Y-cut LiNbO$_3$ piezoelectric substrate and does not have to be the substrate using a Rayleigh wave. The piezoelectric substrate may be, for example, a LiTaO$_3$ piezoelectric substrate using a Leaky wave.

The substrate having piezoelectricity may also have a structure in which a high-acoustic-velocity supporting substrate, a low-acoustic-velocity film, and a piezoelectric film are stacked in this order and may also have a structure in which a supporting substrate, an energy confinement layer, and a piezoelectric film are stacked in this order.

In this preferred embodiment example, the filter 10A is not limited to the ladder surface acoustic wave filter. The filter 10A may have a structure of a type other than the ladder type and may be a bulk acoustic wave filter. Further, the filter 10A may be an LC filter including an inductor and a capacitor. The filter 20A is not limited to the longitudinally coupled surface acoustic wave filter. The filter 20A may have a structure other than the structure of the longitudinally coupling type and may also be a bulk acoustic wave filter. Further, the filter 20A may also be an LC filter including an inductor and a capacitor.

The number of surface acoustic wave resonators included in the longitudinally coupled resonator 31 of the additional circuit 30 may be 3 or more.

5. Effects and the Like

As described above, the multiplexer 1 according to Preferred Embodiment Example 1 includes the common terminal 100, the input/output terminals 110 and 120, the filter 10 connected between the common terminal 100 and the input/output terminal 110 and having the pass band including the first frequency band, the filter 20 connected between the common terminal 100 and the input/output terminal 120 and having the pass band including the second frequency band higher than the first frequency band, and the additional circuit 30 connected in parallel to at least a portion of the path connecting the common terminal 100 and the input/output terminal 110. The additional circuit 30 includes the longitudinally coupled resonator 31 having the plurality of IDT electrodes formed on the substrate having piezoelectricity. If the peak frequency in a response occurring in the bandpass characteristic of the additional circuit 30 and attributed to the IDT electrode is f1, and if the frequency corresponding to the lowest impedance among frequencies higher than the second frequency band in the impedance characteristic at the time of viewing the filters 10 and 20 and the additional circuit 30 from the common terminal 100 is f2, $f2 \times (1-0.0012) \leq f1 \leq f2 \times (1+0.0012)$ is satisfied.

According to this, substantially matching the peak frequency f1 in the IDT response and the frequency f2 corresponding to the lowest impedance in the multiplexer 1 as expressed by the formula above enables the IDT response occurring in the filter 10 (and the additional circuit 30) and at a frequency higher than the second frequency band to be prevented and thus the attenuation characteristic to be improved.

For example, in the multiplexer 1, $f2 \times (1-0.00055) \leq f1 \leq f2 \times (1+0.00055)$ may also be satisfied.

According to this, substantially matching the peak frequency f1 and the frequency f2 as expressed by the formula above enables the IDT response occurring in the filter 10 (and the additional circuit 30) and at a frequency higher than the second frequency band to be prevented and attenuation of about 35 dB or higher to be ensured.

The multiplexer 1A according to Preferred Embodiment Example 2 includes the common terminal 100, the input/output terminals 110 and 120, the filter 10A connected between the common terminal 100 and the input/output terminal 110 and having the pass band including the first frequency band, the filter 20A connected between the common terminal 100 and the input/output terminal 120 and having the pass band including the second frequency band lower than the first frequency band, and the additional circuit 30 connected in parallel to at least a portion of the path connecting the common terminal 100 and the input/output terminal 110. The additional circuit 30 includes the longitudinally coupled resonator 31 having the plurality of IDT electrodes formed on the substrate having piezoelectricity. If the peak frequency in a response occurring in the bandpass characteristic of the additional circuit 30 and attributed to the IDT electrode is f1, and if the frequency corresponding to the lowest impedance among frequencies higher than the second frequency band in the impedance characteristic at the time of viewing the filters 10 and 20 and the additional circuit 30 from the common terminal 100 is f2, $f2 \times (1-0.0012) \leq f1 \leq f2 \times (1+0.0012)$ is satisfied.

According to this, substantially matching the peak frequency f1 in the IDT response and the frequency f2 corresponding to the lowest impedance in the multiplexer 1 as expressed by the formula above enables the IDT response occurring in the filter 10A (and the additional circuit 30) and at a frequency lower than the second frequency band to be prevented and the attenuation characteristic to be improved.

For example, in the multiplexer 1A, $f2 \times (1-0.00055) \leq f1 \leq f2 \times (1+0.00055)$ may also be satisfied.

According to this, substantially matching the peak frequency f1 and the frequency f2 as expressed by the formula above enables the IDT response occurring in the filter 10A (and the additional circuit 30) and at a frequency lower than the second frequency band to be prevented and attenuation of about 35 dB or higher to be ensured.

OTHER MODIFICATIONS AND THE LIKE

Multiplexers have been described with reference to preferred embodiments, but the acoustic wave filters of the present invention is not limited to the preferred embodiments above. Other preferred embodiments implemented by combining any components in the preferred embodiments described above, a modification obtained by applying, to the preferred embodiments above, modifications conceived of by those skilled in the art without departing from the spirit of the present invention, and various types of equipment including the multiplexers according to the preferred embodiments described above included therein are also included in the present invention.

For example, in a multiplexer, an inductor or a capacitor may be connected between components. The inductor may include a wiring inductor defined by wiring connecting the components.

Preferred embodiments of the present invention may be widely used for communications equipment such as a mobile phone, as a multiplexer with low loss and high attenuation applicable to a frequency standard for multiband and multimode.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer comprising:
   a common terminal;
   a first input/output terminal;
   a second input/output terminal;
   a first filter circuit that is connected between the common terminal and the first input/output terminal and that has a pass band including a first frequency band;
   a second filter circuit that is connected between the common terminal and the second input/output terminal and that has a pass band including a second frequency band higher than the first frequency band; and
   an additional circuit connected in parallel to at least a portion of a path connecting the common terminal and the first input/output terminal; wherein
   the additional circuit includes a resonator including a plurality of interdigital transducer electrodes on a piezoelectric substrate; and
   in a case where a peak frequency for a response that occurs in a bandpass characteristic of the additional circuit and that is attributed to the interdigital transducer electrodes is f1, and a frequency included in a frequency higher than the second frequency band and that corresponds to a lowest impedance in an impedance characteristic at a time of viewing the first filter circuit, the second filter circuit, and the additional circuit from the common terminal is f2, $$f2\times(1-0.0012)\le f1\le f2\times(1+0.0012)$$

is satisfied.

2. The multiplexer according to claim 1, wherein $f2\times(1-0.00055)\le f1\le f2\times(1+0.00055)$ is satisfied.

3. The multiplexer according to claim 1, further comprising first and second inductors, wherein the first inductor is arranged in series with the first input/output terminal and the first filter circuit, and the second inductor is arranged in series with the second input/output terminal and the second filter circuit.

4. The multiplexer according to claim 3, wherein the first and second inductors are impedance matching elements.

5. The multiplexer according to claim 1, wherein the additional circuit includes a capacitor, and the resonator is a longitudinally coupled resonator including surface acoustic wave resonators connected to the capacitor.

6. The multiplexer according to claim 5, wherein the longitudinally coupled resonator includes reflectors at both ends thereof.

7. The multiplexer according to claim 1, wherein the additional circuit includes a transversal surface acoustic wave resonator.

8. The multiplexer according to claim 1, wherein the first filter circuit is a ladder acoustic wave filter circuit includes a plurality of surface acoustic wave resonators including serial arm resonators and parallel arm resonators.

9. The multiplexer according to claim 1, wherein the second filter circuit is an acoustic wave filter circuit includes a plurality of surface acoustic wave resonators including a longitudinally coupled resonator, serial arm resonators, and parallel arm resonators.

10. The multiplexer according to claim 1, wherein a filter of each of the first filter circuit and the second filter circuit is one of a ladder surface acoustic filter, a bulk acoustic wave filter, or an LC filter including an inductor and a capacitor.

11. A multiplexer comprising:
    a common terminal;
    a first input/output terminal;
    a second input/output terminal;
    a first filter circuit that is connected between the common terminal and the first input/output terminal and that has a pass band including a first frequency band;
    a second filter circuit that is connected between the common terminal and the second input/output terminal and that has a pass band including a second frequency band higher than the first frequency band; and
    an additional circuit connected in parallel to at least a portion of a path connecting the common terminal and the first input/output terminal; wherein
    the additional circuit includes a resonator including a plurality of interdigital transducer electrodes on a piezoelectric substrate; and
    in a case where a peak frequency for a response that occurs in a bandpass characteristic of the additional circuit and that is attributed to the interdigital transducer electrodes is f1, and a frequency included in a frequency lower than the second frequency band and that corresponds to a lowest impedance in an impedance characteristic at a time of viewing the first filter circuit, the second filter circuit, and the additional circuit from the common terminal is f2, $$f2\times(1-0.0012)\le f1\le f2\times(1+0.0012)$$

is satisfied.

12. The multiplexer according to claim 11, wherein $f2\times(1-0.00055)\le f1\le f2\times(1+0.00055)$ is satisfied.

13. The multiplexer according to claim 11, further comprising first and second inductors, wherein the first inductor is arranged in series with the first input/output terminal and the first filter circuit, and the second inductor is arranged in series with the second input/output terminal and the second filter circuit.

14. The multiplexer according to claim 13, wherein the first and second inductors are impedance matching elements.

15. The multiplexer according to claim 11, wherein the additional circuit includes a capacitor, and the resonator is a longitudinally coupled resonator including surface acoustic wave resonators connected to the capacitor.

16. The multiplexer according to claim 15, wherein the longitudinally coupled resonator includes reflectors at both ends thereof.

17. The multiplexer according to claim 11, wherein the additional circuit includes a transversal surface acoustic wave resonator.

18. The multiplexer according to claim 11, wherein the first filter circuit is a ladder acoustic wave filter circuit includes a plurality of surface acoustic wave resonators including serial arm resonators and parallel arm resonators.

19. The multiplexer according to claim 11, wherein the second filter circuit is an acoustic wave filter circuit includes a plurality of surface acoustic wave resonators including a longitudinally coupled resonator, serial arm resonators, and parallel arm resonators.

20. The multiplexer according to claim 11, wherein a filter of each of the first filter circuit and the second filter circuit is one of a ladder surface acoustic filter, a bulk acoustic wave filter, or an LC filter including an inductor and a capacitor.

* * * * *